United States Patent
Eyres

(10) Patent No.: US 7,137,051 B2
(45) Date of Patent: Nov. 14, 2006

(54) TESTING A MULTIBANK MEMORY MODULE

(75) Inventor: Dean C. Eyres, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 435 days.

(21) Appl. No.: 10/278,685

(22) Filed: Oct. 23, 2002

(65) Prior Publication Data

US 2004/0083330 A1    Apr. 29, 2004

(51) Int. Cl.
*G01R 31/28* (2006.01)
(52) U.S. Cl. .................. 714/724; 714/718
(58) Field of Classification Search ............. 324/758; 365/201; 710/107; 714/738, 724, 718; 439/60; 382/147; 713/600
See application file for complete search history.

(56) References Cited

U.S. PATENT DOCUMENTS

| | | | |
|---|---|---|---|
| 5,686,843 A * | 11/1997 | Beilstein et al. ............ 324/758 |
| 5,923,181 A * | 7/1999 | Beilstein et al. ............ 324/758 |
| 5,959,911 A * | 9/1999 | Krause et al. ............... 365/201 |
| 6,178,518 B1 * | 1/2001 | Toda .......................... 713/600 |
| 6,240,476 B1 * | 5/2001 | Garcia et al. ............... 710/107 |
| 6,321,343 B1 * | 11/2001 | Toda .......................... 713/600 |
| 6,407,566 B1 * | 6/2002 | Brunelle et al. ............ 324/758 |
| 6,651,204 B1 * | 11/2003 | Rajsuman et al. .......... 714/738 |
| 6,669,487 B1 * | 12/2003 | NIshizawa et al. ........... 439/60 |
| 6,701,003 B1 * | 3/2004 | Feinstein .................... 382/147 |
| 6,853,597 B1 * | 2/2005 | Jain .......................... 365/201 |

\* cited by examiner

*Primary Examiner*—David Ton
(74) *Attorney, Agent, or Firm*—Williams, Morgan & Amerson, P.C.

(57) ABSTRACT

A method and system for testing a memory module that has at least a first and second memory bank. The first and second memory banks have a plurality of integrated circuit (IC) devices for storing data and the IC devices have a plurality of control lines coupled thereto. A first portion of the plurality of control lines are allocated to the IC devices of the first bank of the module. A second portion of the plurality of control lines are allocated to the IC devices of the second bank of the module. The IC devices of the first and second banks of the module are tested substantially simultaneously using the first and second portions of the plurality of control lines.

33 Claims, 7 Drawing Sheets

TESTING A MULTIBANK MEMORY MODULE

BACKGROUND OF THE INVENTION

1. Field of the Invention

The present invention relates generally to integrated circuit devices, and, more particularly, to a method and apparatus for testing a multibank memory module.

2. Description of the Related Art

Memory modules generally include a plurality of integrated circuit (IC) memory devices for storing data. Typically, the data is stored within these IC devices in a memory array. The array contains many memory cells, each of which stores a bit of data. In many types of memory devices, such as dynamic random access memories (DRAMs), for example, each of the memory cells stores an electrical charge, where the value of the electrical charge is indicative of the logical bit value stored in the cell. The absence of an electrical charge in the memory cell may indicate a logical "zero;" whereas, the presence of an electrical charge in the memory cell may indicate a logical "one."

During the manufacture of these memory modules, the IC devices are generally tested by applying an input test signal through a plurality of input/output (I/O) lines that couple the IC device to a testing device through an interface, such as an edge connector. The IC devices generally respond to the input test signal by providing a test output signal over the I/O lines to the testing device through the edge connector. The testing device, upon receiving the test output signals from the IC device, evaluates the signals to determine if the integrated circuit device was manufactured in accordance with particular specifications in which it was designed to operate.

Typically, the edge connector that couples the integrated circuit devices to the testing device has a limited number of I/O ports with which to connect with the integrated circuit devices under test. Usually, when the modules are configured with multiple banks, such as two banks, for example, the I/O lines that couple each respective bank to the edge connector are coupled together. Consequently, the control logic is routed from the testing device such that only one bank is active at a time for testing by the testing device over the I/O lines. In this testing fashion, only one bank is reading test input signals and generating test output signals, respectively, from or to the testing device during a given testing session. To effectively check the functionality of the integrated circuit devices, the testing device must generally run a given test multiple times for testing each of the banks of the memory module.

The present invention is directed to overcoming, or at least reducing the effects of, one or more of the problems set forth above.

SUMMARY OF THE INVENTION

In one aspect of the present invention, a method is provided. The method includes allocating a first portion of a plurality of control lines to a first integrated circuit (IC) device of a first bank of a module, and allocating a second portion of the plurality of control lines to a second integrated circuit (IC) device of a second bank of the module. The first and second IC devices of the module are tested substantially simultaneously using the first and second portions of the plurality of control lines.

In another aspect of the present invention, a method is provided. The method includes allocating a first portion of control lines between a first integrated circuit (IC) device of a first bank of a module and a connection device, and allocating a second portion of control lines between a second IC device of a second bank of the module and the connection device. A third portion of control lines are allocated between the first IC device and the second portion of control lines, and a fourth portion of control lines are allocated between the second IC device and the first portion of control lines.

In another aspect of the invention, a system is provided. The system comprises a module including at least a first bank and a second bank, with the first and second banks respectively including at least first and second electronic devices. The system also comprises a connection device and a plurality of control lines. A first portion of the control lines is allocated between the first bank of the module and the connection device, a second portion of the control lines is allocated between the second bank of the module and the connection device, and the first and second banks of the module are tested substantially simultaneously using the first and second portions of the plurality of control lines.

In another embodiment of the present invention, a method for testing a memory module that includes at least a first bank and a second bank is provided. The first and second banks respectively include at least first and second integrated circuit (IC) devices having a plurality of input/output (I/O) lines allocated thereto. The method includes allocating a first group of the plurality of I/O lines to the first IC device, allocating a second group of the plurality of I/O lines to the second IC device, and testing the first and second IC devices of the memory module substantially simultaneously using the first and second groups of the plurality of I/O lines.

In another aspect of the invention, a module is provided. The module comprises at least a first bank and a second bank, with the first and second banks respectively including at least first and second integrated circuit (IC) devices, and a plurality of input/output (I/O) lines coupled to the first and second bank. A first portion of the I/O lines is allocated to the first bank of the module, a second portion of the I/O lines is allocated to the second bank of the module, and wherein the first and second banks of the module are tested substantially simultaneously using the first and second portions of the plurality of I/O lines.

In another aspect of the invention, a system is provided. The system comprises a module including at least a first bank and a second bank, with the first and second banks each including a plurality of integrated circuit (IC) devices. The system further comprises a connection device, a testing device coupled to the connection device, a plurality of input/output (I/O) lines, and control logic. The control logic allocates a first portion of the I/O lines between the first bank of the module and the connection device, allocates a second portion of the I/O lines between the second bank of the module and the connection device, and the testing device tests the IC devices of the first and second banks of the module substantially simultaneously using the first and second portions of the plurality of I/O lines.

BRIEF DESCRIPTION OF THE DRAWINGS

The invention may be understood by reference to the following description, taken in conjunction with the accompanying drawings, in which like reference numerals identify like elements, and in which.

Figure 1:
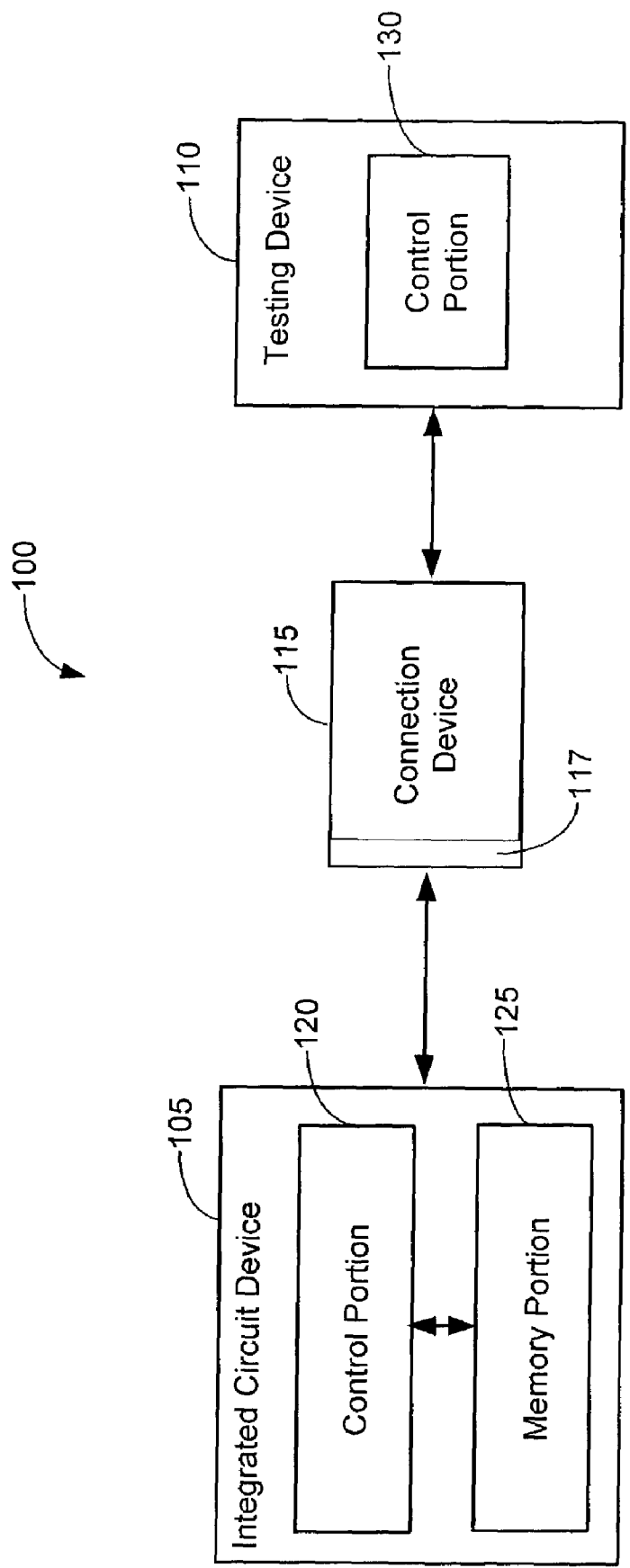
FIG. 1 illustrates a simplified block diagram of an integrated circuit (IC) device test system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a simplified block diagram of an integrated circuit (IC) device test system 100 is shown in accordance with one illustrative embodiment of the present invention. The test system 100 comprises an integrated circuit (IC) device 105 that is operatively coupled to a testing device 110 via a connection device 115. According to the illustrated embodiment, the integrated circuit device 105 assumes the role of a "device under test," and may be diagnostically tested by the testing device 110. Generally, the integrated circuit device 105 is activated and the testing device 110 performs a test process on the integrated circuit device 105 to ascertain whether the integrated circuit device 105 is operating properly within the desired specifications for which the device 105 was designed to operate. The diagnostic testing performed by the testing device 110 may commence subsequent to the encapsulation of the integrated circuit device 105 in the manufacturing process thereof, however, it will be appreciated that the diagnostic testing may be performed at any point during or after the manufacturing of the integrated circuit device 105.

In one embodiment, the integrated circuit device 105 includes a control portion 120 for controlling the overall operation thereof and a memory portion 125 for storing data therein. The control portion 120 interacts with the memory portion 125 within the integrated circuit device 105 to store data to and retrieve data from the memory portion 125. For simplicity and ease in conveying the present invention, the integrated circuit device 105 is shown in FIG. 1 in one of its simplest forms. It will be appreciated, however, that the integrated circuit device 105 may include several other components in addition to or in lieu of the control and memory portions 120, 125 without departing from the spirit and scope of the present invention.

According to the illustrated embodiment, the memory portion 125 of the integrated circuit device 105 may take the form of various types of memories including a dynamic random access memory (DRAM), flash memory, static random access memory (SRAM), double data rate random access memory (DDRRAM), electrically-erasable programmable read only memory (EEPROM), erasable programmable read only memory (EPROM), programmable read only memory (PROM), and read only memory (ROM). It will be appreciated that the memory portion 125 need not necessarily be limited to the aforementioned examples, but may employ a variety of other memory types without departing from the spirit and scope of the present invention. Additionally, it will be appreciated that the integrated circuit device 105 need not necessarily be limited to a memory device as illustrated herein, but may include any type of electronic device within which testing of the device is desired.

The testing device 110 is communicatively coupled to the integrated circuit device 105 via the connection device 115. In accordance with the illustrated embodiment, the testing device 110 takes the form of a memory module tester that is used to test the memory portion 125 of the integrated circuit device 105. The testing device 110 includes a control portion 130 for controlling the overall operation thereof, and for generating diagnostic test signals that are sent to the memory portion 125 of the integrated circuit device 105 to determine whether the memory portion 125 is operating within predefined specifications. In one embodiment, the connection device 115 may take the form of an edge connector for receiving the integrated circuit device 105 within a slot 117 formed therein.

Figure 2:
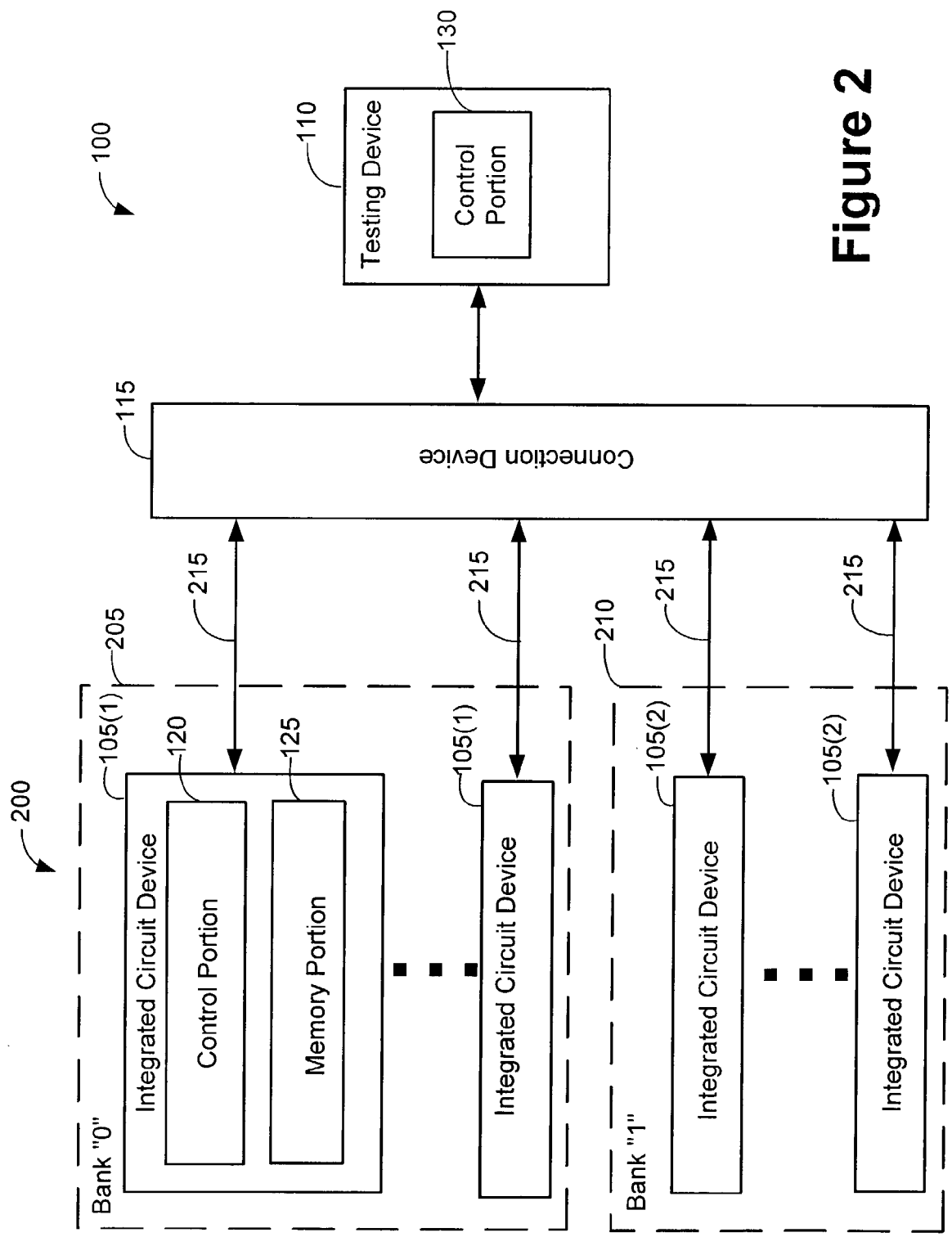
FIG. 2 shows a more detailed representation of the integrated circuit device test system of FIG. 1 according to one illustrative embodiment of the present invention.

Turning now to FIG. 2, a more detailed representation of the integrated circuit device test system 100 is shown according to one embodiment of the present invention. In this particular embodiment, the testing device 110 is configured to perform a simultaneous test on a plurality of integrated circuit devices 105 coupled to the connection device 115. In accordance with the illustrated embodiment, the integrated circuit devices 105 collectively form a memory module 200 that includes two banks 205, 210. Bank "0" (designated by reference numeral 205) includes the integrated circuit devices 105(1), and bank "1" (designated by reference numeral 210) includes the integrated circuit devices 105(2). In accordance with the illustrated embodiment, each bank 205, 210 includes eight integrated circuit devices 105(1, 2). It will be appreciated, however, that each bank 205, 210 may include more or fewer than the eight integrated circuit devices 105(1, 2) of the illustrated embodiment without departing from the spirit and scope of the present invention.

The testing device 110 tests each bank 205, 210 of the integrated circuit devices 105(1, 2) that are coupled to the connection device 115 by transmitting test input signals via the connection device 115 and analyzing the response from the integrated circuit devices 105(1, 2). The test input signals are sent to the memory portion 125 of the integrated circuit devices 105(1, 2) via input/output (I/O) lines 215 that couple the connection device 115 to the integrated circuit devices 105(1, 2). The I/O lines 215 may comprise an address bus, data bus, control signal lines, and the like. In response to receiving the test input signals from the testing device 110, the integrated circuit devices 105(1, 2) of the banks 205, 210 may respond to the test input signals by generating test output signals that are sent to the testing device 110 through the I/O lines 215 to be evaluated thereby.

As previously mentioned, the connection device 115 may be embodied as an edge connector, and the edge connector inherently has a finite length. Due to its fixed length, the connection device 115 may accommodate only a limited number of I/O test lines 215 to couple to the integrated circuit devices 105(1, 2). Therefore, only a limited number of integrated circuit devices 105(1, 2) of the banks 205, 210 may be tested by the testing device 110 at one time because of the limited number of I/O test lines 215. In accordance with the illustrated embodiment, the connection device 115 provides a total of 64 I/O lines for connecting the testing device 110 to the integrated circuit devices 105(1, 2) of the banks 205, 210 that are coupled to the connection device 115. It will be appreciated, however, that the connection device 115 may comprise more or fewer than the 64 I/O lines without departing from the spirit and scope of the present invention. Although the connection device 115 may be designated to provide more than 64 I/O lines, the number of I/O lines 215 provided by the connection device 115 is finite and, therefore, it is desirable to make efficient use of the I/O lines 215 provided thereby. That is, regardless of the number of I/O lines 215 that the connection device 215 may accommodate, it is desirable to perform simultaneous testing on as many integrated circuit devices 105(1, 2) as possible.

Figure 3:
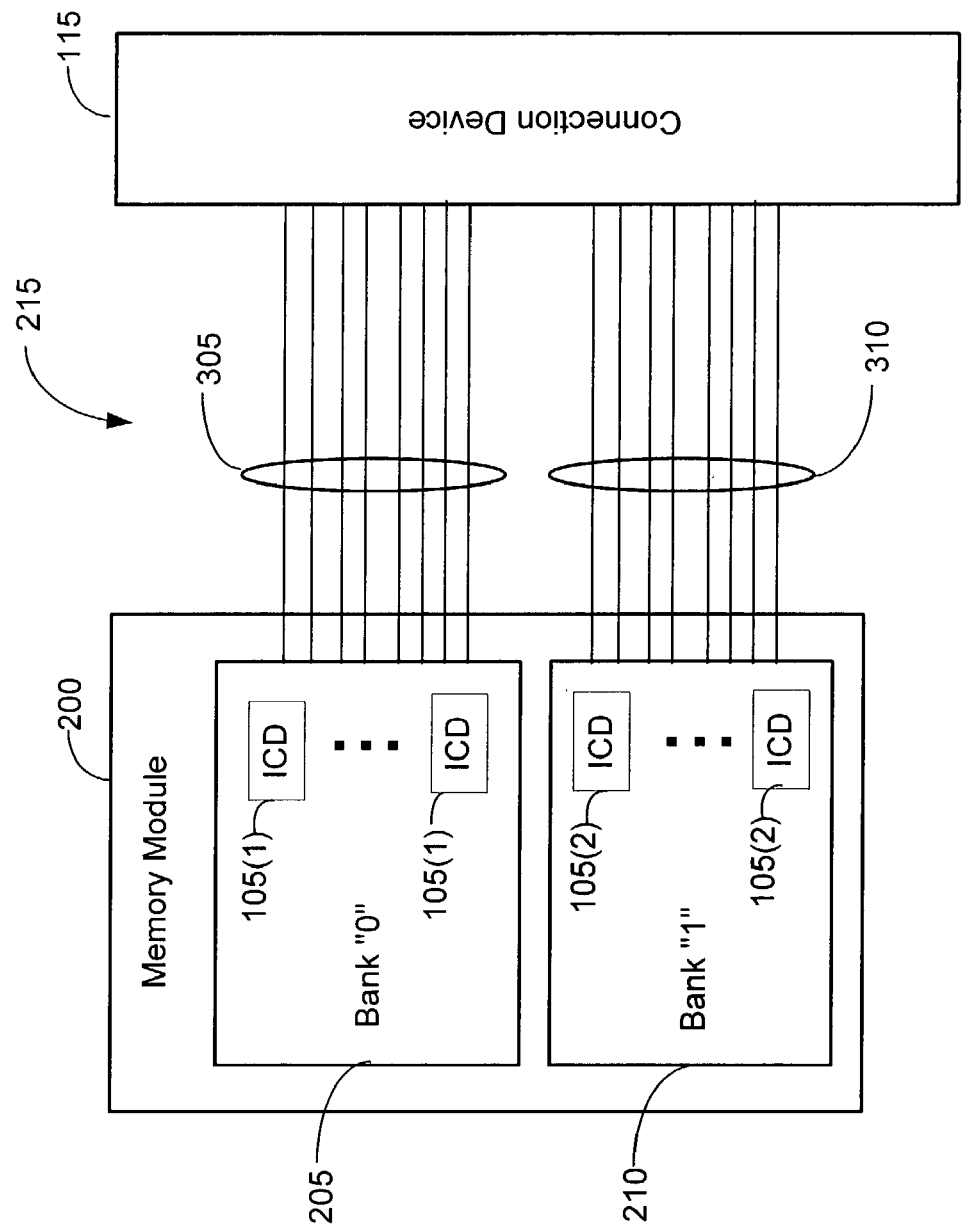
FIG. 3 illustrates a connection of I/O test lines between banks of a memory module and a connection device according to one embodiment of the present invention.

Referring now to FIG. 3, a more detailed representation of the particular connection of the I/O lines 215 between the integrated circuit devices 105(1) (that collectively form the bank 205) and the integrated circuit devices 105(2) (that collectively form the bank 210) and the connection device 115 is shown according to one embodiment of the present invention. In the illustrated embodiment, the bank 205 that includes the integrated circuit devices 105(1) comprises eight I/O test lines 305 that couple to the connection device 115 to receive diagnostic test signals from the testing device 110. Similarly, bank 210 is configured with eight I/O test lines 310 for testing the integrated circuit devices 105(2) that couple to the connection device 115. Although FIG. 3 may illustrate the I/O test lines 305 and 310 as being physically separate and distinct I/O lines, the banks 205 and 210 in reality share the same I/O lines between the integrated circuit devices 105(1) that form bank 205 and the integrated circuit devices 105(2) that form bank 210 and the connection device 115. That is, the I/O test lines 305 and 310 may physically be the same I/O lines; however, functionally, the I/O test lines 305 deliver input test signals from the testing device 110 to the bank 205 and the I/O test lines 310 deliver input test signals from the testing device 110 to the bank 210, but do so over the same "shared" eight I/O lines. Although eight "shared" I/O test lines 305, 310 are provided for the respective banks 205, 210 in the illustrated embodiment, it will be appreciated that the banks 205, 210 may be provided with more or fewer than eight shared I/O test lines without departing from the spirit and scope of the present invention.

Typically, when the integrated circuit devices 105(1, 2) collectively form multiple banks (i.e., bank 205 and bank 210 in the illustrated embodiment), the I/O test lines 305 and 310 from each respective memory bank 205, 210 are coupled together. Control logic is routed from the testing device 110 such that only one memory bank (i.e., either bank 205 or bank 210) is active at one time to be tested by the testing device 110 over the same "shared" I/O test lines, which are collectively represented by 305 and 310 in FIG. 3. In this particular testing fashion, only one bank 205, 210 is reading test input signals and generating test output signals respectively from or to the testing device 110 during a given testing session. To completely check the functionality of the integrated circuit devices 105(1, 2), the testing device 110 may execute a given test at least twice for testing each bank 205, 210 of the memory module 200. In accordance with the present invention, however, a compressed test mode is performed on the banks 205, 210, whereby a select few of the I/O test lines 305 are used by the testing device 110 to test the bank 205 and a select few of the I/O test lines 310 are used by the testing device 110 to test the bank 210 coupled to the connection device 115. Therefore, in accordance with the compressed test mode of the present invention, a fewer number of I/O test lines 305, 310 are needed to test each bank 205, 210 of the memory module 200, thereby enabling the connection device 115 to accommodate more integrated circuit devices 105(1, 2) for simultaneous testing by the testing device 110. This may increase the efficiency of device testing, which may increase the efficiency of the overall manufacturing system.

Figure 4:
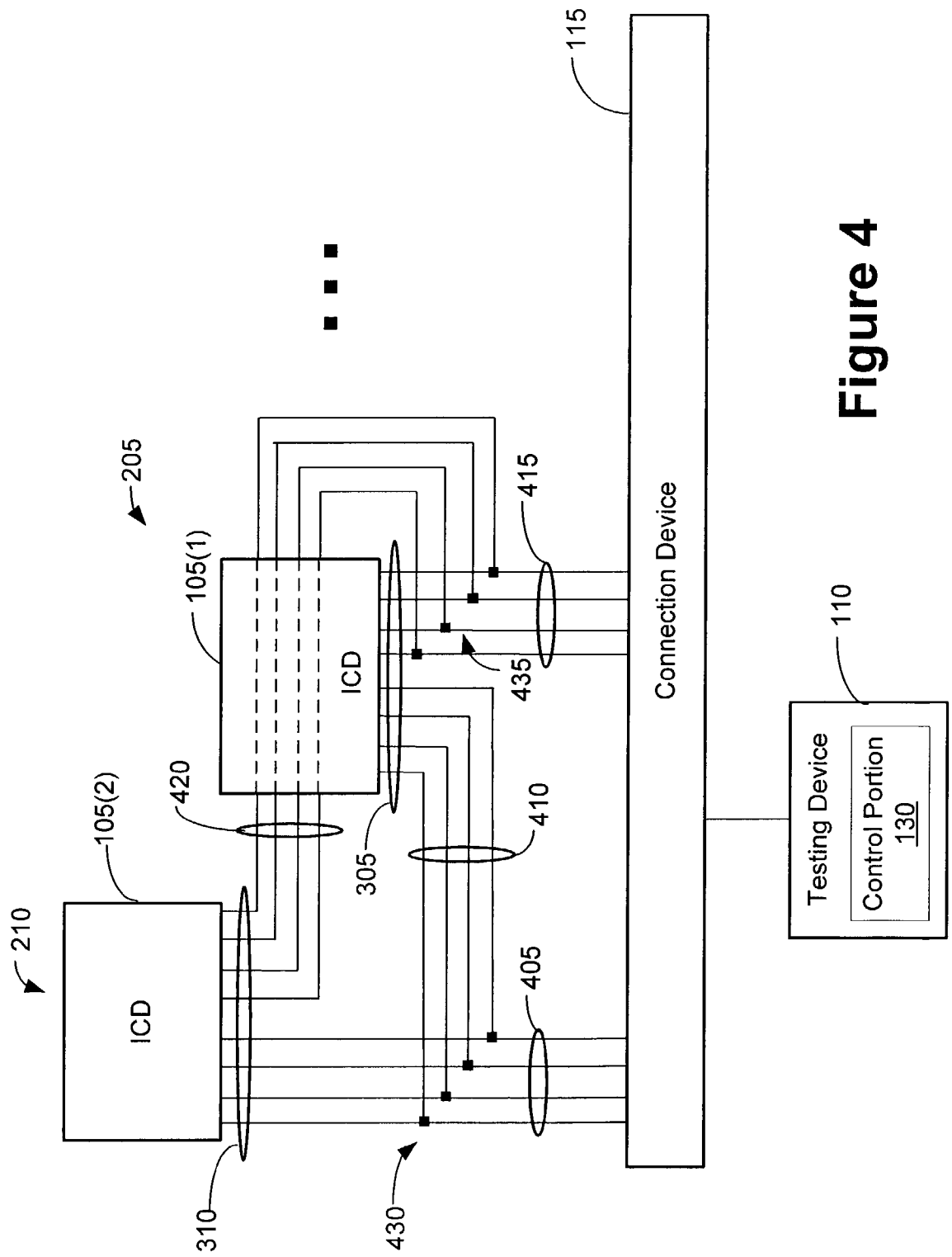
FIG. 4 shows the allocation of certain I/O test lines between integrated circuit devices of the banks of the memory module and the connection device in accordance with one embodiment of the present invention.

Referring now to FIG. 4, the allocation of certain I/O test lines 305, 310 between the respective integrated circuit devices 105(1, 2) of the banks 205, 210 and the connection device 115 is shown in accordance with one embodiment of the present invention. In this particular embodiment, the first four I/O test lines 310 allocated to the integrated circuit device 105(2) of the bank 210, which are designated by the grouping 405, are coupled to the connection device 115 to receive input test signals at the integrated circuit device 105(2) of the bank 210 from the testing device 110. The first four I/O test lines 305 allocated to the integrated circuit device 105(1) of the bank 205, which are designated by the grouping 410, are respectively coupled to each of the four I/O test lines in the grouping 405 at connection points 430. The I/O test lines 305 allocated to the integrated circuit device 105(1) of the bank 205, which are designated by the grouping 415, are coupled to the connection device 115 to receive input test signals at the bank 205 from the testing device 110. The last four I/O test lines 310 allocated to the integrated circuit device 105(2) of the bank 210, which are designated by the grouping 420, are respectively coupled to each of the four I/O test lines in the grouping 415 at connection points 435.

Accordingly, while operating in the compressed test mode, the testing device 110 is capable of sending input test signals via the connection device 115 over the I/O test lines 405 to the integrated circuit device 105(2) of bank 210. The testing device 110 is also capable of simultaneously transmitting input test signals over the I/O test lines 415 to the integrated circuit device 105(1) of bank 205 to perform testing thereof. In response to receiving the test input signals from the testing device 110, the integrated circuit device 105(2) of the bank 210 sends response test output signals over the I/O test lines 405 and the integrated circuit device 105(1) of bank 205 sends response test output signals over the I/O test lines 415. Accordingly, in the compressed test mode, all eight I/O ports of the banks 205, 210 are substantially simultaneously tested, and, thus the integrated circuit devices 105(1, 2) of the banks 205 and 210 need not be tested separately by the testing device 110.

In accordance with the illustrated embodiment of FIG. 4, the I/O test lines 305, 310 assume a "fixed" or "hard-wired" connection as illustrated in FIG. 4. Upon initiating a test of the integrated circuit devices 105(1, 2) of the memory module 200, the control portion 130 of the testing device 110 sends a control signal to the integrated circuit devices 105(1, 2) to operate in a "compressed test mode." The control portion 120 (shown in FIG. 1) of the integrated circuit devices 105(1, 2) configures itself to send output test signals over the I/O test lines 405, 415 in response to the test input signals that are sent by the testing device 110.

Figure 5:
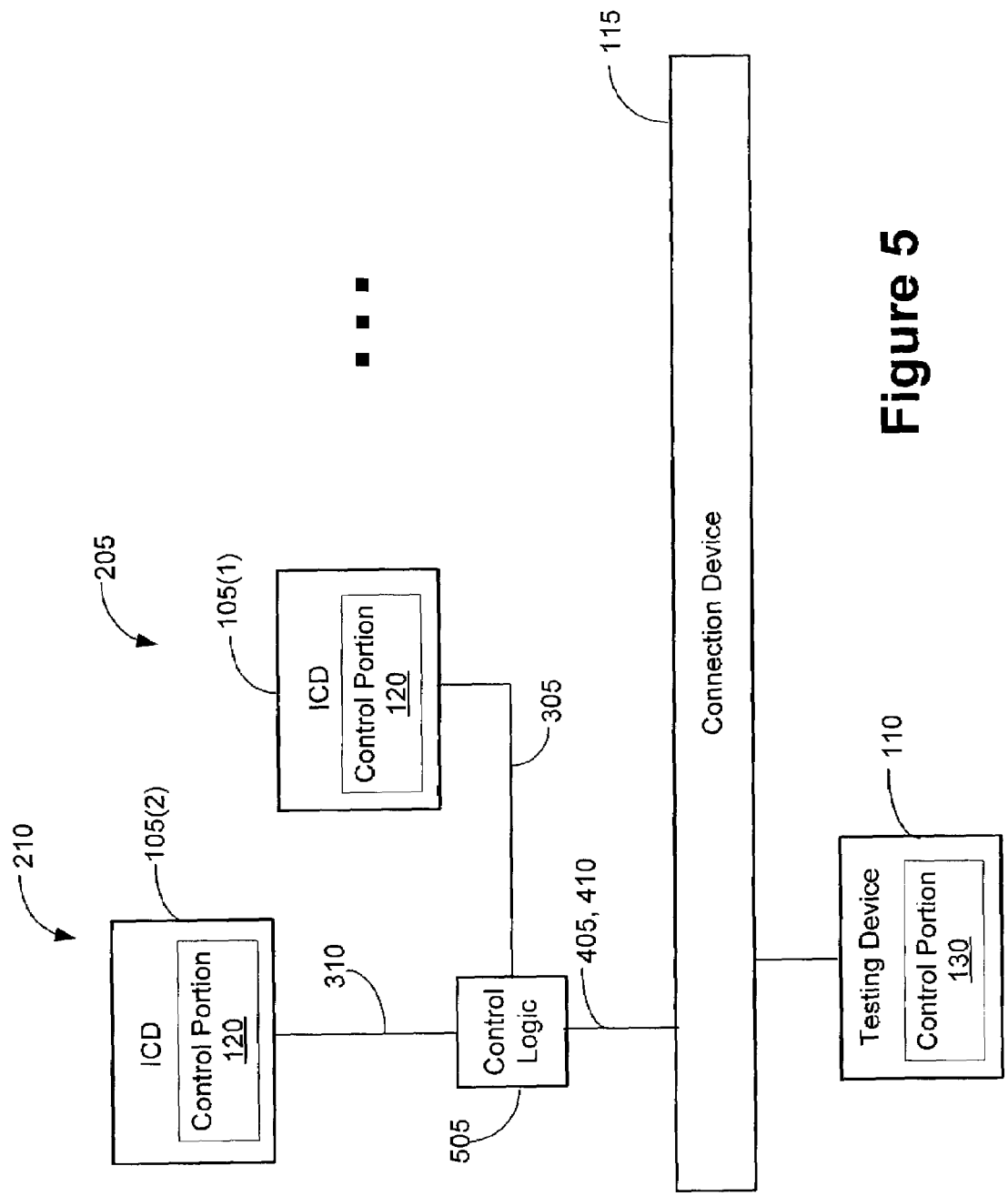
FIG. 5 illustrates a system for implementing particular I/O test line connections from the integrated circuit devices of the banks of the memory module and the connection device according to one embodiment of the present invention.

Turning now to FIG. 5, a system for implementing I/O connections of the integrated circuit devices 105(1, 2) of banks 205, 210 to the connection device 115 is illustrated according to another embodiment of the present invention. In this particular embodiment, control logic 505 switches the connections of the I/O test lines 305, 310 from the respective memory banks 205, 210 to couple the integrated circuit devices 105(1, 2) to the connection device 115 for testing by the testing device 110. The control logic 505 may comprise switching logic, such as a digital or analog switch, for example. In accordance with one embodiment, the testing device 110 may send a signal to the control logic 505 to have the control logic 505 switch the connections of the I/O test lines 305, 310 in the particular configuration as illustrated in FIG. 4, for example. That is, the control logic 505, under the direction of the testing device 110, may configure the I/O test lines 305, 310 on a real-time or near real-time basis as opposed to having the I/O test lines 305, 310 in a "fixed" or "hardwired" configuration as provided in the embodiment illustrated in FIG. 4. In an alternative embodiment of the present invention, the control logic 505 may be controlled by the control portion 120 of the integrated circuit devices 105(1, 2) to configure the I/O test lines 305, 310 between the integrated circuit devices 105(1, 2) and the connection device 115. In yet another embodiment, the control logic 505 may be omitted and the control portions 120 of the integrated circuit devices 105(1, 2) may activate or deactivate certain I/O test lines 305, 310 to establish a connection with the connection device 115.

In response to receiving the control signal from the testing device 110, control logic 505 configures the I/O test lines 310 from the bank 210 to couple the I/O test lines 405 of the integrated circuit device 105(2) of bank 210 to the connection device 115 and to couple I/O test lines 420 of the bank 210 to the I/O test lines 415 of the bank 205 as shown in FIG. 4. Control logic 505 further configures the test I/O lines 305 of the bank 205 to couple the I/O test lines 415 of the integrated circuit device 105(1) of the bank 205 to the connection device 115 and to further couple I/O test lines 410 of the bank 205 to the I/O test lines 405 of the bank 210 as illustrated in FIG. 4. In this particular configuration, the I/O test lines 405 and 415 from the respective banks 210 and 205 are simultaneously coupled to the connection device 115 such that both of the integrated circuit devices 105(1, 2) of the respective banks 205 and 210 may be simultaneously tested by the testing device 110.

Figure 6:
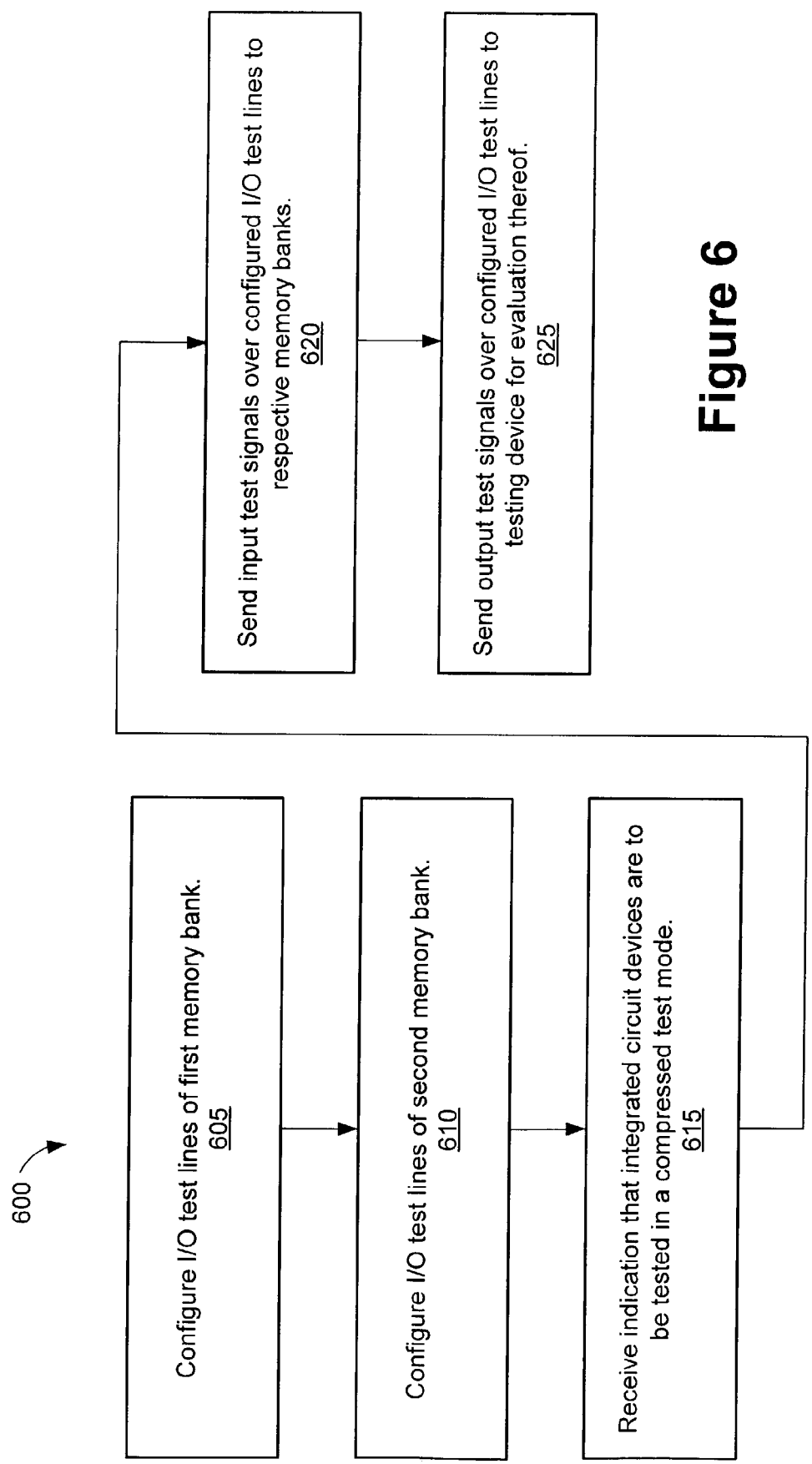
FIG. 6 shows a process for configuring and testing of a plurality of integrated circuit devices in accordance with one illustrative embodiment of the present invention.

Turning now to FIG. 6, a process 600 for configuring and testing the plurality of integrated circuit devices 105(1, 2) of the memory module 200 is provided in accordance with one embodiment of the present invention. At block 605, the I/O test lines 405 allocated to the integrated circuit device 105(2) of bank 210 are configured to couple to the connection device 115, and the I/O test lines 420 allocated to the integrated circuit device 105(2) of the bank 210 are configured to couple to the I/O test lines 415 of the integrated circuit device 105(1) of the bank 205 (as shown in FIG. 4). At block 610, the I/O test lines 415 of the integrated circuit device 105(1) of bank 205 are configured to couple to the connection device 115, and the I/O test lines 410 of the integrated circuit device 105(1) of the bank 205 are coupled to the I/O test lines 405 of the integrated circuit device 105(2) of the bank 210 (also shown in FIG. 4).

At block 615, control portion 130 of the testing device 110 sends a control signal to the control portions 120 of the integrated circuit devices 105(1, 2) that places the integrated circuit devices 105(1, 2) in a compressed test mode. In an alternative embodiment, the compressed test mode signal may be generated internally within the control portion 120 of the integrated circuit devices 105(1, 2), or the integrated circuit devices 105(1, 2) may alternatively be pre-configured to operate in the compressed test mode. When disposed in the compressed test mode, the integrated circuit devices 105(1, 2) will respond to the testing device over the I/O test lines 405, 415 that are directly coupled to the connection device 115.

At block 620, the testing device 110 sends input test signals over the configured I/O test lines 405 and 415 to the banks 210 and 205, respectively, to perform diagnostic testing thereof. At block 625, the testing device 110 receives output test signals from the respective integrated circuit devices 105(1, 2) of banks 205, 210 and evaluates the output test signals to determine whether the memory portion 125 of the integrated circuit devices 105(1, 2) is properly operating within its desired design specifications.

Figure 7:
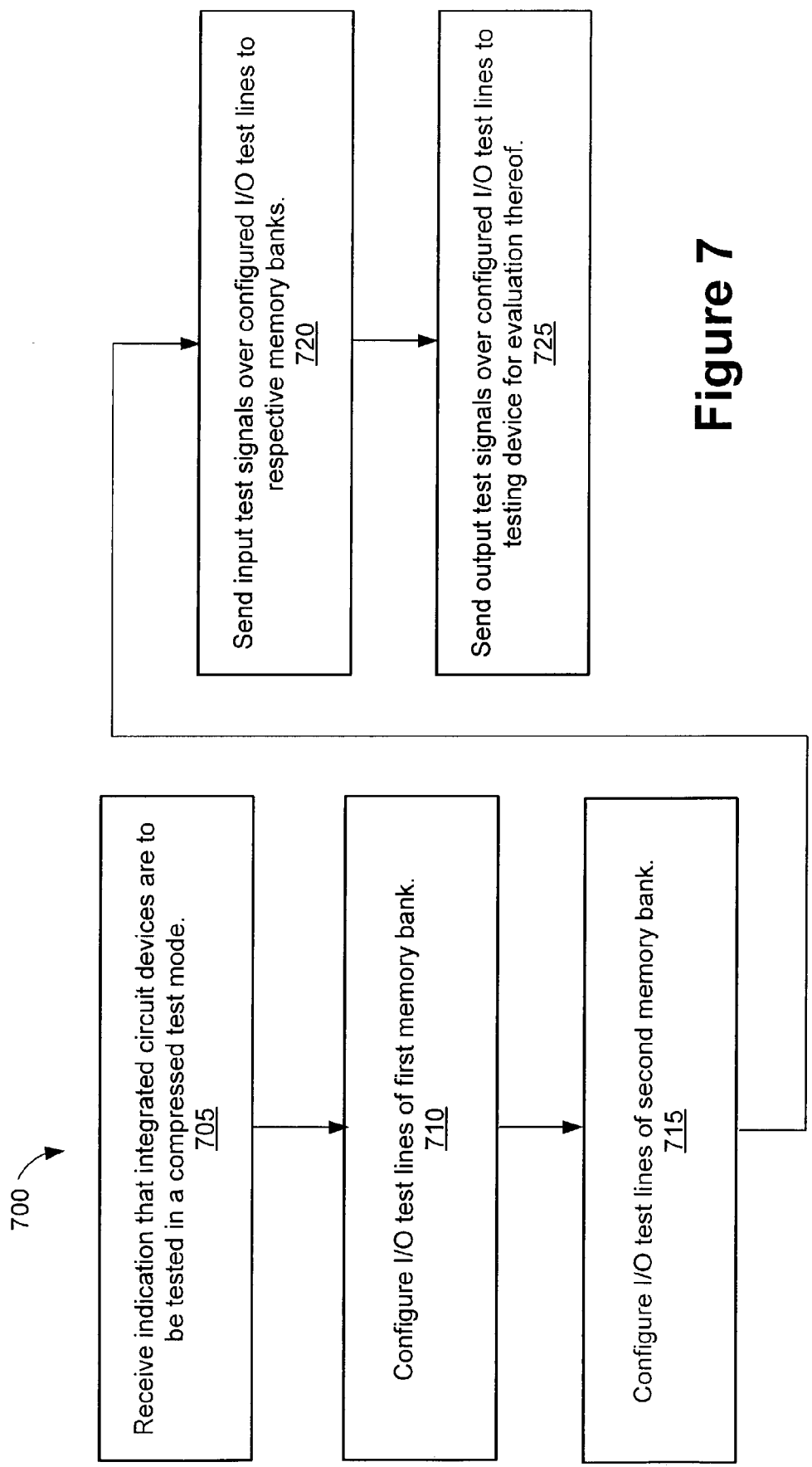
FIG. 7 shows a process for configuring and testing of a plurality of integrated circuit devices in accordance with another illustrative embodiment of the present invention.

Turning now to FIG. 7, an alternative process 700 for configuring and testing the plurality of integrated circuit devices 105(1, 2) of the memory module 200 is provided in accordance with another embodiment of the present invention. At block 705, control logic 505 receives a signal that indicates that the integrated circuit devices 105(1, 2) are to be tested in a compressed test mode. In accordance with one embodiment, the compressed test mode signal may be generated by the testing device 110 and sent to the integrated circuit device 105(1, 2). Alternatively, the compressed test mode signal may be generated internally within the integrated circuit devices 105(1, 2) and sent to the control logic 505, or the integrated circuit devices 105(1, 2) may alternatively be pre-configured to operate in the compressed test mode. At block 710, control logic 505 configures the I/O test lines 310 for the integrated circuit device 105(2) of the bank 210. According to one embodiment, control logic 505 configures the I/O test lines 310 to couple the I/O test lines 405 of the integrated circuit device 105(2) of the bank 210 to the connection device 115, and to couple I/O test lines 420 of the integrated circuit device 105(2) of the bank 210 to the I/O test lines 415 of the integrated circuit device 105(1) of the memory bank 205 (as shown in FIG. 4). At block 715, control logic 505 further configures the I/O test lines 305 for the integrated circuit device 105(1) of the bank 205. In one embodiment, control logic 505 configures the I/O test lines 305 to couple the I/O test lines 415 of the integrated circuit device 105(1) of the bank 205 to the connection device 115, and to further couple the I/O test lines 410 of the integrated circuit device 105(1) of the bank 205 to the I/O test lines 405 of the integrated circuit device 105(2) of the bank 210 (also shown in FIG. 4). It will be appreciated that the tasks indicated in blocks 710 and 715 may be simultaneously performed by control logic 505 without departing from the spirit and scope of the present invention.

At block 720, the testing device 110 sends input test signals over the configured I/O test lines 405 and 415 to the integrated circuit devices 105(1, 2), respectively, to perform diagnostic testing thereof. At block 725, the testing device 110 receives output test signals from the respective integrated circuit devices 105(1, 2) and evaluates the output test signals to determine whether the integrated circuit devices 105(1, 2) are properly operating within their desired design specifications.

In accordance with the compressed test mode of the present invention, simultaneous testing may be performed on the integrated circuit devices 105(1, 2) of banks 205 and 210 using the same number of I/O test lines that would ordinarily be used to test one bank individually. Additionally, because fewer I/O test lines are needed overall to test both banks 205, 210 simultaneously, a greater number of integrated circuit devices 105(1, 2) may be accommodated by the connection device 115, thereby providing testing of these devices in an efficient and expedient manner.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    allocating a first portion of a plurality of control lines to a first integrated circuit (IC) device of a first bank of a module;
    allocating a second portion of the plurality of control lines to a second integrated circuit (IC) device of a second bank of the module; and
    testing the first and second IC devices of the module substantially simultaneously using the first and second portions of the plurality of control lines.

2. The method of claim 1, further comprising:
    allocating a third portion of the plurality of control lines between the first IC device and the second portion of the plurality of control lines; and
    allocating a fourth portion of the plurality of control lines between the second IC device and the first portion of the plurality of control lines.

3. The method of claim 1, wherein testing the first and second IC devices, further comprises:
    sending test signals from a testing device substantially simultaneously through the first and second portions of the plurality of control lines to the first and second IC devices.

4. The method of claim 3, further comprising:
    sending test response signals through the first and second portions of the plurality of control lines respectively from the first and second IC devices to the testing device; and
    evaluating the test response signals at the testing device.

5. A method, comprising:
    allocating a first portion of control lines between a first integrated circuit (IC) device of a first bank of a module and a connection device;
    allocating a second portion of control lines between a second IC device of a second bank of the module and the connection device;
    allocating a third portion of control lines between the first IC device and the second portion of control lines;
    allocating a fourth portion of control lines between the second IC device and the first portion of control lines; and
    testing at least one of the first, second, third, and fourth IC devices of the module substantially simultaneously using at least one of the first, second, third, and fourth portions of the plurality of control lines.

6. The method of claim 5, further comprising:
    sending test signals through the first and second portion of control lines to the first and second IC devices from a testing device coupled to the connection device.

7. The method of claim 6, wherein sending test signals further comprises:
    sending test signals through the first and second portion of control lines to the first and second IC devices substantially simultaneously from a testing device coupled to the connection device.

8. The method of claim 6, further comprising:
    sending test response signals through the first and second portion of control lines respectively from the first and second IC devices to the testing device; and
    evaluating the test response signals at the testing device.

9. A method for testing a memory module that includes at least a first bank and a second bank, the first and second banks respectively including at least first and second integrated circuit (IC) devices having a plurality of input/output (I/O) lines allocated thereto, the method comprising:
    allocating a first group of the plurality of I/O lines to the first IC device;
    allocating a second group of the plurality of I/O lines to the second IC device; and
    testing the first and second IC devices of the memory module substantially simultaneously using the first and second groups of the plurality of I/O lines.

10. The method of claim 9, further comprising:
    allocating a third group of the plurality of I/O lines between the first IC device and the second group of the plurality of I/O lines; and
    allocating a fourth group of the plurality of I/O lines between the second IC device and the first group of the plurality of I/O lines.

11. The method of claim 9, wherein testing the first and second IC devices of the memory module, further comprises:
    sending test signals from a testing device substantially simultaneously through the first and second groups of the plurality of I/O lines to the first and second IC devices of the memory module.

12. The method of claim 11, further comprising:
    sending test response signals through the first and second groups of the plurality of I/O lines respectively from the first and second IC devices to the testing device; and
    evaluating the test response signals at the testing device.

13. A system, comprising:
    a module including at least a first bank and a second bank, the first and second banks respectively including at least first and second electronic devices;
    a connection device; and
    a plurality of control lines; and
    wherein a first portion of the control lines is allocated between the first bank of the module and the connection device, a second portion of the control lines is allocated between the second bank of the module and the connection device, and the first and second banks of the module are tested substantially simultaneously using the first and second portions of the plurality of control lines.

14. The system of claim 13, wherein a third portion of the plurality of control lines is allocated between the first bank and the second portion of the plurality of control lines, and a fourth portion of the plurality of control lines is allocated between the second bank and the first portion of the plurality of control lines.

15. The system of claim 13, wherein test signals are sent from a testing device substantially simultaneously through the first and second portions of the plurality of control lines to the first and second banks of the module to test the first and second electronic devices.

16. The system of claim 15, wherein test response signals are sent through the first and second portions of the plurality of control lines respectively from the first and second banks to the testing device to be evaluated thereby.

17. The system of claim 13, wherein the electronic device comprises an integrated circuit (IC) device.

18. The system of claim 13, wherein the first and second banks respectively comprise first and second memory banks for storing data therein.

19. The system of claim 13, wherein the connection device comprises an edge connector.

20. The system of claim 13, wherein the control lines comprise input/output (I/O) test lines.

21. A module, comprising:
at least a first bank and a second bank, the first and second banks respectively including at least first and second integrated circuit (IC) devices; and
a plurality of input/output (I/O) lines coupled to the first and second bank; and
wherein a first portion of the I/O lines is allocated to the first bank of the module, a second portion of the I/O lines is allocated to the second bank of the module, and wherein the first and second banks of the module are tested substantially simultaneously using the first and second portions of the plurality of I/O lines.

22. The module of claim 21, wherein a third portion of the plurality of I/O lines is allocated to the first bank and the second portion of the plurality of I/O lines, and a fourth portion of the plurality of I/O lines is allocated to the second bank and the first portion of the plurality of I/O lines.

23. The module of claim 21, wherein test signals are sent from a testing device substantially simultaneously through the first and second portions of the plurality of I/O lines to the first and second banks of the module to test the first and second IC devices.

24. The module of claim 23, wherein test response signals are sent through the first and second portions of the plurality of I/O lines respectively from the first and second banks to the testing device to be evaluated thereby.

25. The module of claim 21, wherein the first and second banks respectively comprise first and second memory banks for storing data therein.

26. The module of claim 21, wherein the connection device comprises an edge connector.

27. A system, comprising:
a module including at least a first bank and a second bank, the first and second banks each including a plurality of integrated circuit (IC) devices;
a connection device;
a testing device coupled to the connection device;
a plurality of input/output (I/O) lines;
control logic; and
wherein the control logic allocates a first portion of the I/O lines between the first bank of the module and the connection device, allocates a second portion of the I/O lines between the second bank of the module and the connection device, and wherein the testing device tests the IC devices of the first and second banks of the module substantially simultaneously using the first and second portions of the plurality of I/O lines.

28. The system of claim 27, wherein the control logic further allocates a third portion of the plurality of I/O lines between the first bank and the second portion of the plurality of I/O lines, and allocates a fourth portion of the plurality of I/O lines between the second bank and the first portion of the plurality of I/O lines.

29. The system of claim 27, wherein test signals are sent from the testing device substantially simultaneously through the first and second portions of the plurality of I/O lines to the first and second banks of the module to test the first and second banks.

30. The system of claim 29, wherein test response signals are sent through the first and second portions of the plurality of I/O lines respectively from the first and second banks to the testing device to be evaluated thereby.

31. The system of claim 27, wherein the control logic is controlled by the testing device.

32. The system of claim 27, wherein the control logic is controlled by the integrated circuit devices.

33. The system of claim 27, wherein the control logic comprises switching logic.

* * * * *